United States Patent
Kennedy et al.

(10) Patent No.: US 9,488,276 B2
(45) Date of Patent: Nov. 8, 2016

(54) SLIDING ELEMENT, IN PARTICULAR A PISTON RING, HAVING A COATING

(71) Applicant: FEDERAL-MOGUL BURSCHEID GMBH, Burscheid (DE)

(72) Inventors: Marcus Kennedy, Dusseldorf (DE);
Ralf Lammers, Wermelskirchen (DE);
Yuriy Ivanov, Burscheid (DE);
Michael Zinnabold, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 0 days.

(21) Appl. No.: 14/439,813

(22) PCT Filed: Oct. 31, 2013

(86) PCT No.: PCT/EP2013/072781
§ 371 (c)(1),
(2) Date: Apr. 30, 2015

(87) PCT Pub. No.: WO2014/068040
PCT Pub. Date: May 8, 2014

(65) Prior Publication Data
US 2015/0292622 A1    Oct. 15, 2015

(30) Foreign Application Priority Data

Oct. 31, 2012  (DE) .................. 10 2012 219 930

(51) Int. Cl.
*C23C 28/00* (2006.01)
*F16J 9/28* (2006.01)
(Continued)

(52) U.S. Cl.
CPC .............. *F16J 9/28* (2013.01); *C23C 14/0605* (2013.01); *F16J 9/26* (2013.01)

(58) Field of Classification Search
CPC .............. F16J 9/28; F16J 9/26; C23C 16/26; C23C 16/50; B82Y 30/00; B82Y 40/00; Y10T 428/30
USPC ......... 277/442; 428/336, 408, 457, 701, 704
See application file for complete search history.

(56) References Cited

U.S. PATENT DOCUMENTS 4,783,368 A    11/1988  Yamamoto et al.
5,198,285 A     3/1993  Arai et al.
(Continued)

FOREIGN PATENT DOCUMENTS

DE          4040456 A1    6/1992
DE          4419713 A1   12/1994
(Continued)

*Primary Examiner* — Archene Turner
(74) *Attorney, Agent, or Firm* — Robert L. Stearns; Dickinson Wright, PLLC

(57) ABSTRACT

The present application relates to a sliding element, in particular a piston ring, having at least one sliding surface which has a coating which has, from the inside outwards, a metal-containing bonding layer and a DLC layer, where the DLC layer is an amorphous hydrogen-free diamond-like carbon layer which has a DLC main layer which extends from the bonding layer to an adjoining DLC covering layer and has a carbon content of more than about 98.5 at %, oxygen and/or hydrogen and/or nitrogen in a proportion of in each case less than about 0.5 at % and an sp2/sp3 ratio of the carbon in the range from about 1 to about 3, and a DLC covering layer which extends from the DLC main layer to the surface of the sliding element and has a lower carbon content and/or higher oxygen content and/or higher hydrogen content compared to the main layer and also metals and/or metal oxides and an sp2/sp3 ratio of the carbon in the range from about 1 to about 3.

23 Claims, 2 Drawing Sheets

(51) Int. Cl.
*C23C 14/06* (2006.01)
*F16J 9/26* (2006.01)

(56) References Cited

U.S. PATENT DOCUMENTS

| | | | |
|---|---|---|---|
| 5,843,571 A | 12/1998 | Sho | |
| 7,406,940 B2* | 8/2008 | Nishimura | C10M 145/08 |
| | | | 123/193.2 |
| 7,493,882 B2* | 2/2009 | Hiraishi | F16J 9/00 |
| | | | 123/193.2 |
| 7,820,293 B2* | 10/2010 | Dekempeneer | C23C 28/044 |
| | | | 428/457 |
| 8,304,063 B2* | 11/2012 | Ito | C23C 14/0605 |
| | | | 428/408 |
| 2005/0118426 A1 | 6/2005 | Miyake et al. | |
| 2007/0224349 A1* | 9/2007 | Hosenfeldt | C23C 14/024 |
| | | | 428/688 |
| 2008/0220257 A1 | 9/2008 | Dekempeneer | |

FOREIGN PATENT DOCUMENTS

| | | | |
|---|---|---|---|
| DE | 19850218 C1 | | 3/2000 |
| DE | 102005063123 B3 | | 5/2007 |
| DE | 102008016864 B3 | | 10/2009 |
| DE | 102008022039 A1 | | 11/2009 |
| DE | 10 2011 003 254 | * | 8/2012 |
| EP | 0724023 A1 | | 7/1996 |
| JP | 2000128516 A | | 5/2000 |
| WO | 2010/020274 | * | 2/2010 |

* cited by examiner

SLIDING ELEMENT, IN PARTICULAR A PISTON RING, HAVING A COATING

BACKGROUND OF THE INVENTION

1. Technical Field

The invention relates to a sliding element, in particular a piston ring, having at least one sliding surface that has a coating which comprises, from the inside outwards, a metal-containing bonding layer and a DLC layer consisting of a covering layer and a main layer.

2. Related Art

Increasingly stricter legal provisions and heightened customer wishes for a lower fuel consumption by internal combustion engines require a sustained reduction in mechanical friction losses. However, this is also accompanied by significantly increased component requirements owing to the introduction of performance optimisations such as direct injection and turbocharging, which for their part require particularly wear-resistant components.

To safeguard the service life of highly stressed piston rings, hard-metal coatings are being increasingly used, such as described in DE 44 19 713. Metal nitrides, such as, for example, CrN and TiN, are thereby configured as a single or multilayer, mostly by means of physical vapour deposition.

In order to reduce the friction in the system piston ring/cylinder barrel face, amorphous DLC (diamond-like carbon) coatings are used (VDI Standard 2840). However, these have a service life that is still too short. And, owing to the formation of internal stresses that reduce the adhesiveness and thus the service life, the thickness of the layers to be applied is limited to approximately 5 him, such as described in DE 10 2005 063 123 B.

DE 40 40 456 C1 and DE 198 50 218 C1 describe the production of amorphous, hydrogen-free, diamond-like carbon layer systems using conventional sputtering processes or so-called vacuum arc processes. The high degree of hardness of the layers promises improved wear values. The hardness is thereby substantially determined by the bonding character, i.e. the ratio of sp2 to sp3 carbon bonds. The higher the sp3 content, the harder and more rigid the DLC layer.

The production of so-called hydrogen-free or oxygen- and hydrogen-free, amorphous, diamond-like layers is described in DE 10 2008 022 039 A1 and EP 0 724 023 A1.

However, the high degree of hardness and the high elastic modulus of amorphous, hydrogen-free, diamond-like carbon layers are also accompanied by some technological problems. On the one hand, the surfaces of the very hard layers must be very smooth in order to prevent the occurrence of disruptions on the surface at a high surface pressure and thus the failure of the layer system. Furthermore, a so-called bi-metallic effect occurs owing to different thermal expansion coefficients of the basic material of the piston ring and the coating thereof. This bi-metallic effect is intensified further owing to differences in the elastic modulus of the two materials. As a consequence, when the temperature increases, an increased pressure occurs in the joint region of the piston ring, which can cause increased wear. Furthermore, the partner element (cylinder barrel face) can be damaged by scoring and high liner wear.

SUMMARY OF THE INVENTION

The object forming the basis for the invention is to create a sliding element, in particular a piston ring for internal combustion engines, which has optimal mechanical and tribological properties. The object is more precisely to provide such a sliding element, the surface of which ensures the lowest possible friction and/or the lowest possible wear and/or a high scuff resistance and/or an optimal sealing and oil scraping owing to a high geometry robustness, and thereby allows a piston ring having a long service life. As compared to existing hard material systems, an increased hardness and/or a high wear resistance with sufficient shear strength and/or low friction and/or inertia is thereby being sought. Furthermore, the bi-metallic effect should be prevented to the greatest possible extent.

The sliding element, in particular a piston ring, has at least one sliding surface, on which a coating is applied which comprises, from the inside outwards, a metal-containing bonding layer and a DLC layer, the DLC layer being an amorphous, hydrogen-free, diamond-like carbon layer comprising a DLC main layer that extends from the bonding layer to an adjoining DLC covering layer and has a carbon content of more than about 98.5 at %, oxygen and/or hydrogen and/or nitrogen in a proportion of in each case less than about 0.5 at % and an sp2/sp3 ratio of the carbon of between about 1 and about 3, and a DLC covering layer that extends from the DLC main layer to the surface of the sliding element and has a lower carbon content and/or higher oxygen content and/or higher hydrogen content as compared to the main layer and also has metals and/or metal oxides and an sp2/sp3 ratio of the carbon of between about 1 and about 3.

The described sliding element has proven to be advantageous as regards the reduction of friction and wear owing to the high degree of hardness and the good inertia properties of the DLC layer. The sp2/sp3 ratio according to the invention is particularly advantageous for reducing the average ring wear over the ring circumference and the wear in the joint region of the piston ring owing to the reduction of the bi-metallic effect inter alia by reducing the elastic modulus. The geometry robustness that is increased as a result thereof furthermore contributes to obtaining an optimal seal and oil scraping.

Furthermore, in particular the range of the sp2/sp3 ratio according to the invention is advantageous since it allows the setting of an optimal property combination of hardness and elasticity of the DLC layer. For optimal tribological properties, the metal is advantageously predominantly present in the DLC covering layer as metal oxide and thereby acts as a solid lubricant. Overall, this thus results in a sliding element which has high wear resistance and an increased service life.

The DLC layer advantageously has an sp2/sp3 ratio of the carbon of preferably approximately 1.05 to approximately 2. This preferred range allows the DLC layer to adapt well to the basic material of the sliding element. The elastic modulus can in particular be advantageously reduced and thus the elasticity of the DLC layer can be improved and, for example, the bi-metallic effect reduced.

In a further preferred embodiment, the DLC covering layer contains iron and iron oxides, whereby these iron oxides can be FeO and $Fe_3O_4$, as was demonstrated by means of x-ray diffraction. The DLC covering layer furthermore advantageously comprises an iron content of approximately 30 at % or less. It is known from literature that iron oxides as solid lubricants can cause a reduction in friction. They are furthermore significantly softer materials than hydrogen-free DLC coatings, as a result of which the run-in behaviour can be considerably improved. A defined surface portion of these metals and metal oxides leads to an optimisation of wear, run-in behaviour and friction. Based on measurements using scanning electron microscopy in the so-called BSE (Back Scattered Electrons) mode, the surface portion of the metal and metal oxides directly at the surface could be determined according to a preferred embodiment of the invention. The surface portion is approximately 5 to 40%, preferably approximately 5 to 25%.

It is particularly preferred for the metals and/or metal oxides comprised by the DLC covering layer to be present or more specifically embedded in particular in roughness valleys of the DLC covering layer. It is furthermore preferred for the metals and/or metal oxides to only be present in the covering layer.

The DLC covering layer furthermore preferably has a carbon content of approximately 25 at % or less and an oxygen content of preferably approximately 50 at % or less.

Under normal atmospheric conditions, a surface of the covering layer advantageously has approximately 20 at % to approximately 30 at % C—O bonds, approximately 8 at % to approximately 15 at %, preferably approximately 10 at % to approximately 15 at % C═O bonds, and approximately 6 at % to approximately 10 at % O—C═O bonds. The C—O bond proportion that is increased in particular in the layer according to the invention leads to an increased saturation of the carbon bond and advantageously to a reduction in wear and friction.

The DLC covering layer has a thickness of up to approximately 2 µm, preferably approximately 1 µm, and the DLC main layer has a thickness of approximately 5 µm up to approximately 40 µm. The preferred thicknesses ensure in a positive manner a long service life and operating duration of the coating and thus a long-lasting protection against abrasive and adhesive wear and component failure.

In the DLC covering layer, the metal content and/or the oxygen content and/or the hydrogen content advantageously increase towards the outside thereof. The preferred increased concentration of these elements at the outside leads to advantageous tribological properties of the coating and to a reduction of the average ring wear over the ring circumference and of the wear in the joint region of the piston ring.

The DLC layer preferably has a hardness of approximately 1800 to 3500 HV0.02 and/or further preferred an elastic modulus of approximately 150 to 320 GPa. The combination of a high degree of hardness as compared to conventional hard metal materials and reduced elastic moduli as compared to conventional, in particular hydrogen-free, DLC materials is particularly advantageous since the wear resistance and geometry robustness can be increased and the bi-metallic effect reduced in this manner.

The DLC layer advantageously further has a mean roughness depth of Rz<approximately 2 µm, preferably Rz<approximately 1 µm, and a reduced peak height of Rpk<approximately 0.15 µm, preferably Rpk<approximately 0.1 µm. This low roughness, which can be achieved in softer surface areas with a low amount of technical effort, is particularly advantageous since a failure of the layer system owing to disruption that is due to unevenness in the hard carbon layers can be reduced in this manner.

The bonding layer preferably has a thickness of approximately 0.05 to approximately 1.0 µm and furthermore preferably contains chromium or titanium. The basic material of the sliding element is furthermore preferably cast-iron or steel. This embodiment as according to the invention ensures in the first place an optimal and sustainable bonding of the wear-reducing DLC layers with the basic material of the sliding element, and thus significantly contributes to the functionability thereof.

DETAILED DESCRIPTION OF EMBODIMENTS OF THE INVENTION

Figure 1:
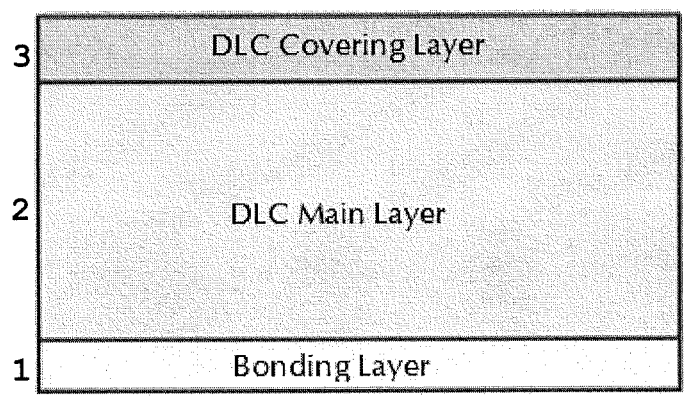
FIG. 1 shows a representation of the schematic structure of a coating of a sliding element.

FIG. 1 shows the structure as according to the invention of a coating of a sliding element. The bonding layer 1 is directly attached to the basic material of the sliding element. The DLC main layer 2 is applied to this bonding layer, and the DLC covering layer 3 is applied as the surface layer to the DLC main layer.

Figure 2:
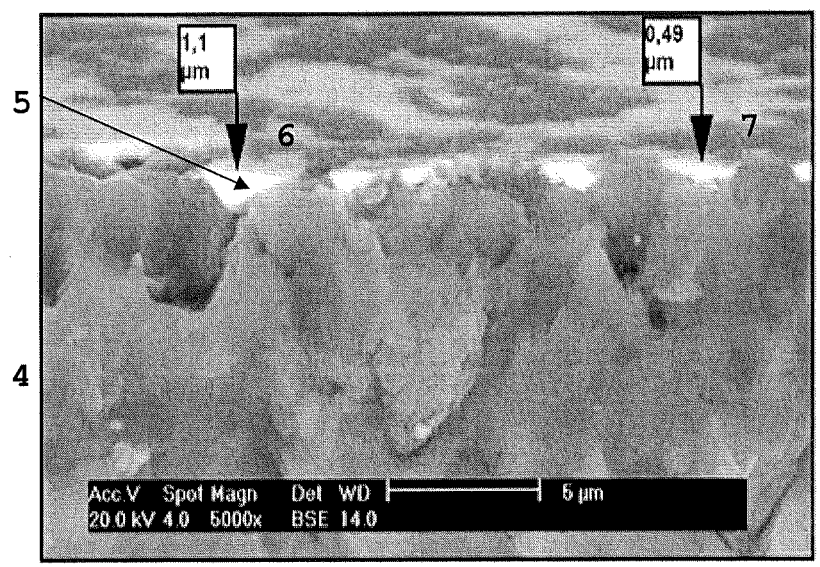
FIG. 2 shows a scanning electron micrograph in the BSE (Back Scattered Electrons) mode of a layer breakage of a polished, amorphous, hydrogen-free, diamond-like carbon layer.

FIG. 2 shows a scanning electron micrograph of the coating in a side view. In the material-dependent BSE (Back Scattered Electrons) contrast, the carbon-containing material 4 is black-grey. White areas close to the layer surface are furthermore apparent, which represent iron-containing material 5. The arrows 6 and 7 each indicate the thicknesses of the iron-containing material at selected measuring points provided as examples.

Table 1 provides an overview of three different coatings of a sliding element, in particular a piston ring, and lists the names, manufacturing processes, layer thicknesses, mechanical properties and sp2/sp3 ratios thereof. The layer system "PtaC2" thereby corresponds to a preferred embodiment of the present invention.

Figure 3:
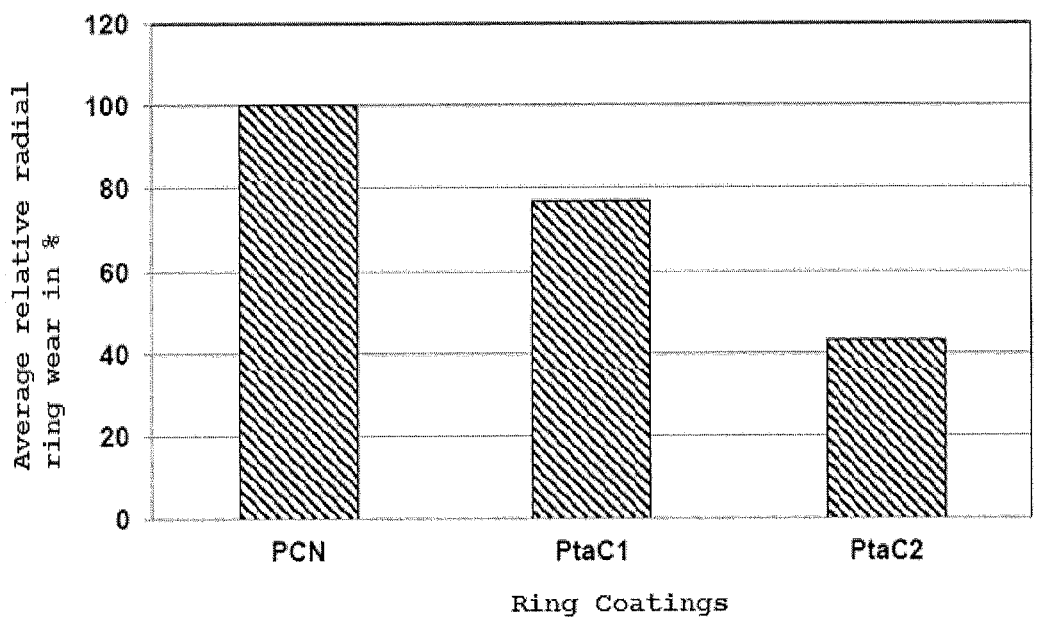
FIG. 3 shows the average relative ring wear values over the ring circumference of the sliding elements described and tested in Table 1.
Figure 4:
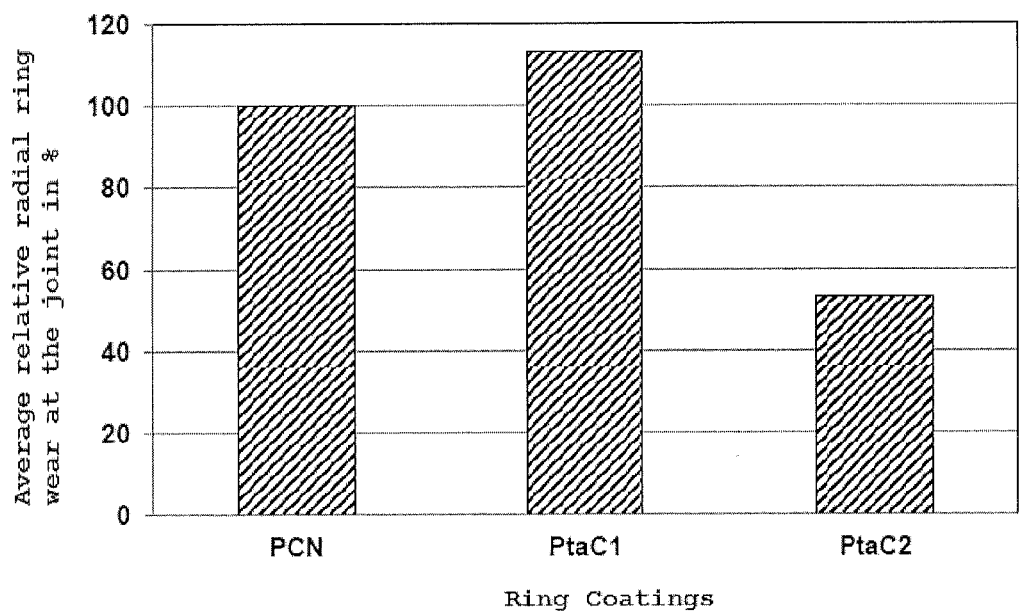
FIG. 4 shows the average relative ring wear values in the joint region of the sliding elements described and tested in Table 1.

All sliding elements were validated in an engine test, i.e. in a highly-stressed diesel engine having a combustion pressure of 200 bar and a specific power of 71 kW/liter swept volume. FIG. 3 and FIG. 4 show a comparison of the average relative ring wear over the ring circumference and the average relative ring wear in the joint region after 500 hours of running time, with the prior art in the form of the CrN coating being used as a reference (100%). The preferred embodiment proves to be particularly advantageous, i.e. comparatively low-wear. That this is caused by the reduced sp3 content seems unusual as compared to the prior art since "PtaC2" has a lower degree of hardness and a lower elastic modulus than "PtaC1".

Furthermore, the sealing effect of piston rings produced from the coatings in Table 1 was ascertained by means of a contour plot on clamped rings. The radial pressure over the entire ring circumference is then determined therefrom.

As compared to "PtaC1", the preferred embodiment "PtaC2" is characterised by an almost pressure-free area with a low indent in the ring joint and is light-tight. This suggests a good geometry robustness and sealing effect also at higher temperatures.

Furthermore, the necessary surface processing of the layers designated "PtaC" can modify the microstructure and surface composition thereof. It was, for example, measured by means of SIMS (Secondary Ion Mass Spectrometry) that following processing/smoothing, the oxygen content in the "PtaC1" and "PtaC2" layers increased from <approximately 0.5 at % at a depth of approximately 500 nm up to the basic material to up to approximately 47 at % in the region close to the surface. The iron content also increased from <approximately 1% to up to approximately 23% and the carbon content reduced from approximately 99 at % at the depth of the DLC layer to up to approximately 30 at % in the region close to the surface.

TABLE 1

| Name | Manufacturing process | Layer thickness [μm] | Elastic modulus [GPa] | Hardness [HV0.02] | Sp2/sp3 ratio |
|---|---|---|---|---|---|
| PCN | PVD | 32 | 230-270 | 1180-1370 | — |
| "PtaC1" | PVD | 22 | 370-410 | 3300-4500 | 0.8-1 |
| "PtaC2" | PVD | 23 | 185-210 | 2470-2940 | 1.05-2 |

Based on SEM (Scanning Electron Microscopy) examinations, Table 2 specifies the Fe surface portions for the coatings "PtaC1" and "PtaC2". Table 2 furthermore specifies, based on XPS (X-ray Photoelectron Spectroscopy) measurements and therefore for an approximately 10 nm thick region of the surface, i.e. of the covering layer 3, the carbon-oxygen-bonding ratios.

As compared to "PtaC1", the coating "PtaC2", which corresponds to a preferred embodiment of the invention, is characterised by a comparatively large Fe surface portion, as well as by a higher proportion of C—O single bonds. It is to be expected that in a normal atmosphere the carbon not bound to oxygen will bind to hydrogen, which has a lower enthalpy of formation than a C—O bond, and the "PtaC1" will therefore have a lower wear resistance and a higher friction than the "PtaC2" as according to the invention. This type of bond is, however, not detectable using XPS.

TABLE 2

| Layer name | Fe surface portion [%] (SEM Measurements) | C O bond proportions [at %] (XPS Measurements) | | |
|---|---|---|---|---|
| | | C—O | C=O | O—C=O |
| "PtaC1" | 13.8-27.3 | 11.7 | 10.3 | 6.0 |
| "PtaC2" | 11.7-36.5 | 24.7 | 11.3 | 8.0 |

The sliding element according to the invention can be produced by means of PVD processes, whereby for example chromium as the bonding layer and carbon are vaporised, ionised and deposited via electromagnetic fields on a basic material of the sliding member. The further processing of the sliding element is carried out by a subsequent process, in which a transfer of material from a metallic processing material occurs in connection with a thermochemical process, for example temperature-induced oxidation. As a result, corresponding metal and/or metal oxides deposit in roughness valleys of the DLC covering layer, as is clearly apparent from the white areas in FIG. 2.

The invention claimed is:

1. A sliding element, in particular a piston ring, which has at least one sliding surface having a coating comprising, from the inside outwards,
a metal-containing bonding layer and a DLC layer,
wherein the DLC layer is an amorphous, hydrogen-free, diamond-like carbon layer comprising a DLC main layer that extends from the bonding layer to an adjoining DLC covering layer and has a carbon content of more than about 98.5 at %, oxygen and/or hydrogen and/or nitrogen in a proportion of in each case less than about 0.5 at % and an sp2/sp3 ratio of the carbon of between about 1 and about 3, and
wherein the DLC covering layer extends from the DLC main layer to the surface of the sliding element and has a lower carbon content and/or higher oxygen content and/or higher hydrogen content as compared to the main layer and also has metals and/or metal oxides and an sp2/sp3 ratio of the carbon of between about 1 and about 3.

2. The sliding element according to claim 1, wherein the DLC layer has an sp2/sp3 ratio of the carbon of 1.05 to approximately 2.

3. The sliding element according to claim 1, wherein the DLC covering layer comprises iron and/or iron oxides.

4. The sliding element according to claim 3, wherein the iron oxides are FeO and/or $Fe_3O_4$.

5. The sliding element according to claim 1, wherein the DLC covering layer has an iron content of approximately 30 at % or less.

6. The sliding element according to claim 1, wherein the DLC covering layer has a carbon content of approximately 25 at % or more.

7. The sliding element according to claim 1, wherein the DLC covering layer has an oxygen content of approximately 50 at % or less.

8. The sliding element according to claim 1, wherein a surface of the DLC covering layer has the following C O bond proportions: C—O approximately 20 at % to approximately 30 at %, C=O approximately 8 at % to approximately 15 at %, O—C=O approximately 6 at % to approximately 10 at %.

9. The sliding element of claim 8, wherein C=0 is 10 at % to 15 at %.

10. The sliding element according to claim 1, wherein the metals and/or metal oxides disposed at the surface of the coating have a surface portion of approximately 5 to 40%.

11. The sliding element of claim 10, wherein the surface portion of the metals and/or metal oxides disposed at the surface of the coating is 5 to 25%.

12. The sliding element according to claim 1, wherein the DLC covering layer has a thickness of up to approximately 2 μm.

13. The sliding element of claim 12, wherein the thickness is approximately 1 μm.

14. The sliding element according to claim 1, wherein the DLC main layer has a thickness of approximately 5 μm to approximately 40 μm.

15. The sliding element according to claim 1, wherein the metal content and/or the oxygen content and/or the hydrogen content increase(s) in the DLC covering layer towards the outside thereof.

16. The sliding element according to claim 1, wherein the DLC layer has a hardness of approximately 1800 to 3500 HV0.02.

17. The sliding element according to claim 1, wherein the DLC layer has an elastic modulus of approximately 150 to 320 GPa.

18. The sliding element according to claim 1, wherein the DLC layer has a mean roughness depth of Rz<approximately 2 μm, and a reduced peak height of Rpk<approximately 0.15 μm.

19. The sliding element of claim 18, wherein Rz<approximately 1 μm.

20. The sliding element of claim 18, wherein Rpk<approximately 1 μm.

21. The sliding element according to claim 1, wherein the bonding layer has a thickness of approximately 0.05 μm to approximately 1.0 μm.

22. The sliding element according to claim 1, wherein the bonding layer comprises chromium or titanium.

23. The sliding element according to claim 1, wherein a basic material of the sliding element is cast-iron or steel.

* * * * *

UNITED STATES PATENT AND TRADEMARK OFFICE
CERTIFICATE OF CORRECTION

PATENT NO. : 9,488,276 B2
APPLICATION NO. : 14/439813
DATED : November 8, 2016
INVENTOR(S) : Marcus Kennedy et al.

It is certified that error appears in the above-identified patent and that said Letters Patent is hereby corrected as shown below:

Column 1 Line 32 Remove "5 him" and insert --5 Mm--

Column 6 Line 7 Insert --that-- after covering layer

Signed and Sealed this
Fifteenth Day of August, 2017

Joseph Matal
*Performing the Functions and Duties of the
Under Secretary of Commerce for Intellectual Property and
Director of the United States Patent and Trademark Office*